(12) United States Patent
Chang et al.

(10) Patent No.: US 12,482,737 B2
(45) Date of Patent: Nov. 25, 2025

(54) INTELLIGENT POWER MODULE PACKAGE STRUCTURE AND HYBRID CERAMIC BOARD

(71) Applicant: TONG HSING ELECTRONIC INDUSTRIES, LTD., Taipei (TW)

(72) Inventors: Chia-Shuai Chang, Hsin-Chu County (TW); Shu-Yi Liang, Taipei (TW); Yan-Wei Chen, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 368 days.

(21) Appl. No.: 18/366,662

(22) Filed: Aug. 7, 2023

(65) Prior Publication Data

US 2024/0363516 A1 Oct. 31, 2024

(30) Foreign Application Priority Data

Apr. 28, 2023 (TW) .................................. 112115891

(51) Int. Cl.
*H01L 23/498* (2006.01)
*H01L 23/00* (2006.01)
*H01L 23/31* (2006.01)

(52) U.S. Cl.
CPC .. *H01L 23/49838* (2013.01); *H01L 23/49811* (2013.01); *H01L 23/49833* (2013.01); *H01L 24/48* (2013.01); *H01L 24/49* (2013.01); *H01L 23/3121* (2013.01); *H01L 23/49861* (2013.01); *H01L 2224/48091* (2013.01); *H01L 2224/48227* (2013.01); *H01L 2224/49175* (2013.01)

(58) Field of Classification Search
CPC .................................................. H01L 23/49838
See application file for complete search history.

(56) References Cited

U.S. PATENT DOCUMENTS

2017/0064808 A1* 3/2017 Rizza ...................... H01L 25/18

* cited by examiner

Primary Examiner — Douglas M Menz
(74) Attorney, Agent, or Firm — Li & Cai Intellectual Property Office

(57) ABSTRACT

An intelligent power module (IPM) package structure and a hybrid ceramic board are provided. The hybrid ceramic board includes an insulating ceramic layer, a conductive layer connected to the insulating ceramic layer, and a direct-plated copper (DPC) ceramic substrate that is fixed onto the insulating ceramic layer. The conductive layer has a circuit layout slot recessed from an outer surface thereof to the insulating ceramic layer. The conductive layer has a plurality of first circuits, and any two of the first circuits adjacent to each other have a first conductor space therebetween that has a first minimal critical interval. The DPC ceramic substrate is disposed in the circuit layout slot and has a plurality of second circuits. Any two of the second circuits adjacent to each other have a second conductor space therebetween that has a second minimal critical interval less than the first minimal critical interval.

12 Claims, 10 Drawing Sheets

INTELLIGENT POWER MODULE PACKAGE STRUCTURE AND HYBRID CERAMIC BOARD

CROSS-REFERENCE TO RELATED PATENT APPLICATION

This application claims the benefit of priority to Taiwan Patent Application No. 112115891, filed on Apr. 28, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a ceramic board, and more particularly to an intelligent power module (IPM) package structure and a hybrid ceramic board.

BACKGROUND OF THE DISCLOSURE

A conventional ceramic substrate can be classified into different types according to different forming manners of conductive layers thereof, so that the different types of the conventional ceramic substrate can be provided for meeting different requirements. Specifically, the different forming manners of the conductive layers cannot be implemented on a same ceramic layer, so that configurations of the conventional ceramic substrate are limited, and are not suitable for being applied to a specific package structure (e.g., an IPM package structure).

SUMMARY OF THE DISCLOSURE

In response to the above-referenced technical inadequacies, the present disclosure provides an intelligent power module (IPM) package structure and a hybrid ceramic board for effectively improving on the issues associated with conventional ceramic substrates.

In order to solve the above-mentioned problems, one of the technical aspects adopted by the present disclosure is to provide an intelligent power module (IPM) package structure, which includes a ceramic carrier, a direct-plated copper (DPC) ceramic substrate, a plurality of first metal wires, a chip, and a plurality of second metal wires. The ceramic carrier includes an insulating ceramic layer, a first conductive layer, and a second conductive layer. The insulating ceramic layer has a first surface and a second surface that is opposite to the first surface. The first conductive layer is connected to the first surface. The first conductive layer has a circuit layout slot that is recessed along a predetermined direction from an outer surface thereof to the first surface of the insulating ceramic layer. The first conductive layer has a plurality of first circuits spaced apart from each other. Any two of the first circuits adjacent to each other have a first conductor space therebetween that has a first minimal critical interval. The second conductive layer is connected to the second surface. The DPC ceramic substrate is disposed in the circuit layout slot and is fixed onto the first surface. Moreover, a surrounding lateral side of the DPC ceramic substrate is not in contact with inner walls of the circuit layout slot so as to jointly form an annular gap therebetween. Along the predetermined direction, a top side of the DPC ceramic substrate and the outer surface of the first conductive layer have a step difference therebetween that is less than or equal to 300 μm. The top side of the DPC ceramic substrate has a plurality of second circuits. Any two of the second circuits adjacent to each other have a second conductor space therebetween that has a second minimal critical interval being less than the first minimal critical interval. The first metal wires are connected to the ceramic carrier and the DPC ceramic substrate so as to establish an electrical connection between the ceramic carrier and the DPC ceramic substrate. The chip is disposed on the first conductive layer of the ceramic carrier. The second metal wires are connected to the chip and the DPC ceramic substrate so as to establish an electrical connection between the chip and the DPC ceramic substrate.

In order to solve the above-mentioned problems, another one of the technical aspects adopted by the present disclosure is to provide a hybrid ceramic board, which includes a ceramic carrier and a direct-plated copper (DPC) ceramic substrate. The ceramic carrier includes an insulating ceramic layer, a first conductive layer, and a second conductive layer. The insulating ceramic layer has a first surface and a second surface that is opposite to the first surface. The first conductive layer is connected to the first surface. The first conductive layer has a circuit layout slot that is recessed along a predetermined direction from an outer surface thereof to the first surface of the insulating ceramic layer. The first conductive layer has a plurality of first circuits spaced apart from each other. Any two of the first circuits adjacent to each other have a first conductor space therebetween that has a first minimal critical interval. The second conductive layer is connected to the second surface. The DPC ceramic substrate is disposed in the circuit layout slot and is fixed onto the first surface. Moreover, a surrounding lateral side of the DPC ceramic substrate is not in contact with inner walls of the circuit layout slot so as to jointly form an annular gap therebetween. Along the predetermined direction, a top side of the DPC ceramic substrate and the outer surface of the first conductive layer have a step difference therebetween that is less than or equal to 300 μm. The top side of the DPC ceramic substrate has a plurality of second circuits. Any two of the second circuits adjacent to each other have a second conductor space therebetween that has a second minimal critical interval being less than the first minimal critical interval.

Therefore, any one of the IPM package structure and the hybrid ceramic board of the present embodiment is provided with a specific configuration (e.g., the first circuits and the second circuits in the specific configuration having different conductor spaces and being substantially coplanar with each other) that is different from the configuration of the conventional ceramic substrate, so that the hybrid ceramic board allows for a wider variety of electronic components to be mounted thereon for meeting a broader range of requirements and simplifying a manufacturing process of the IPM package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
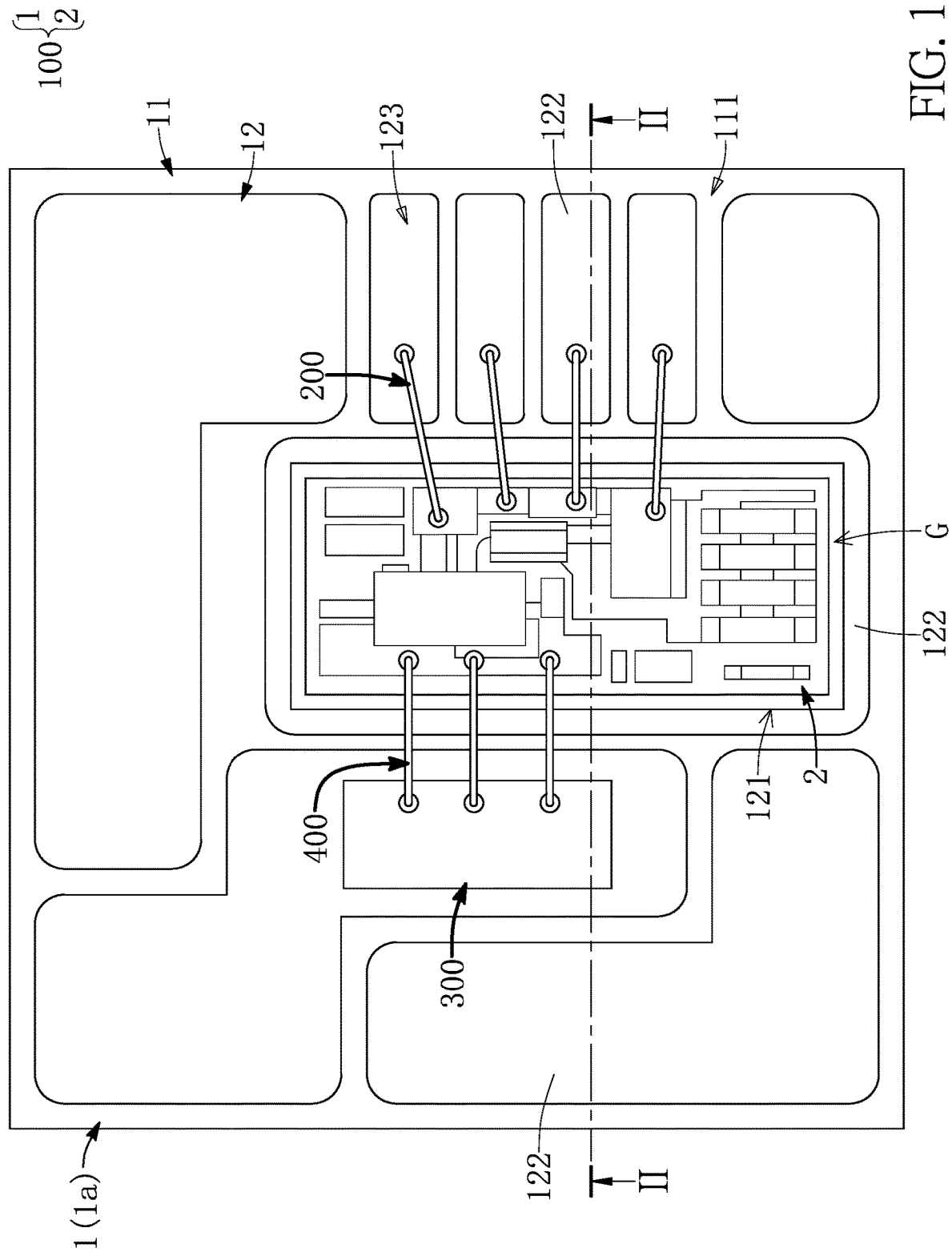
FIG. 1 is a schematic top view of a hybrid ceramic board having a first configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
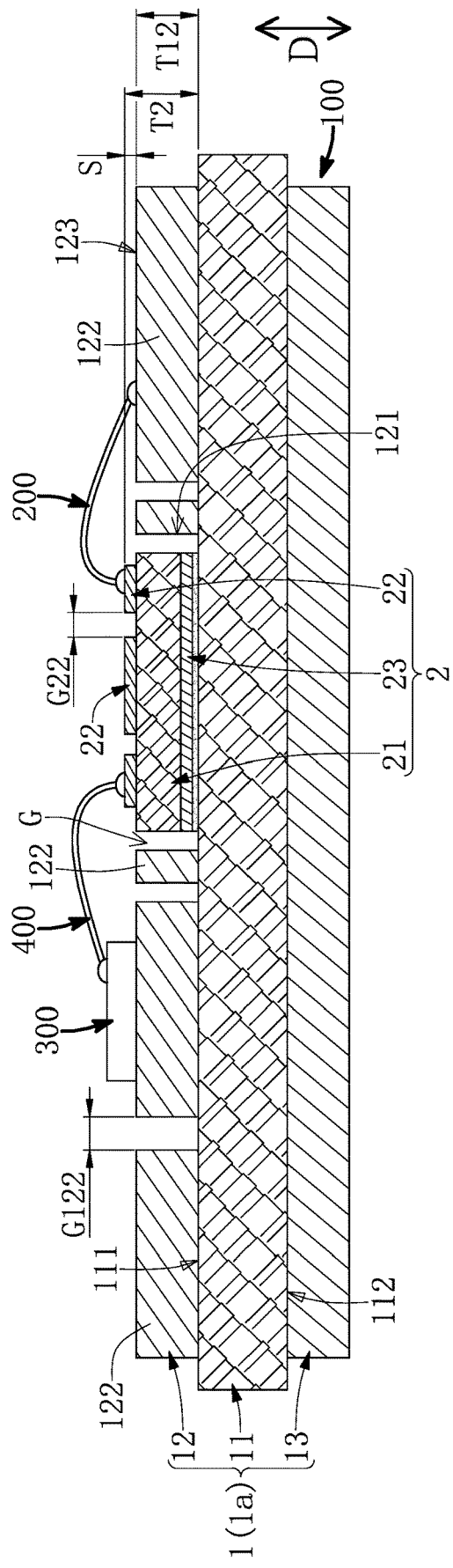
FIG. 2 is a schematic cross-sectional view taken along line II-II of FIG. 1.

Referring to FIG. 1 to FIG. 7, a first embodiment of the present disclosure is provided. As shown in FIG. 1 and FIG. 2, the present embodiment provides a hybrid ceramic board 100 including a ceramic carrier 1 and a direct-plated copper (DPC) ceramic substrate 2 that is assembled onto the ceramic carrier 1. In the present embodiment, the ceramic carrier 1 and the DPC ceramic substrate 2 respectively have conductor spaces that are different from each other, thereby jointly providing a conductor space having a wider range. Moreover, the ceramic carrier 1 of the hybrid ceramic board 100 is not electrically coupled to the DPC ceramic substrate 2.

The ceramic carrier 1 in the present embodiment is a three-layer structure including an insulating ceramic layer 11 (e.g., an aluminum oxide layer or an aluminum nitride layer), a first conductive layer (e.g., a copper layer), and a second conductive layer (e.g., a copper layer). In other words, the insulating ceramic layer 11 provided by the present embodiment is a single-layer board, but the present disclosure is not limited thereto.

The insulating ceramic layer 11 is a flat surface, and has a first surface 111 and a second surface 112 that is opposite to the first surface 111. The first conductive layer 12 is connected to the first surface 111, and the second conductive layer 13 is connected to the second surface 112. It should be noted that the ceramic carrier 1 in the present embodiment is a direct bonded copper (DBC) ceramic substrate 1a, and the first conductive layer 12 and the second conductive layer 13 are sintered onto the first surface 111 and the second surface 112 of the insulating ceramic layer 11, respectively, but the present disclosure is not limited thereto.

Figure 3:
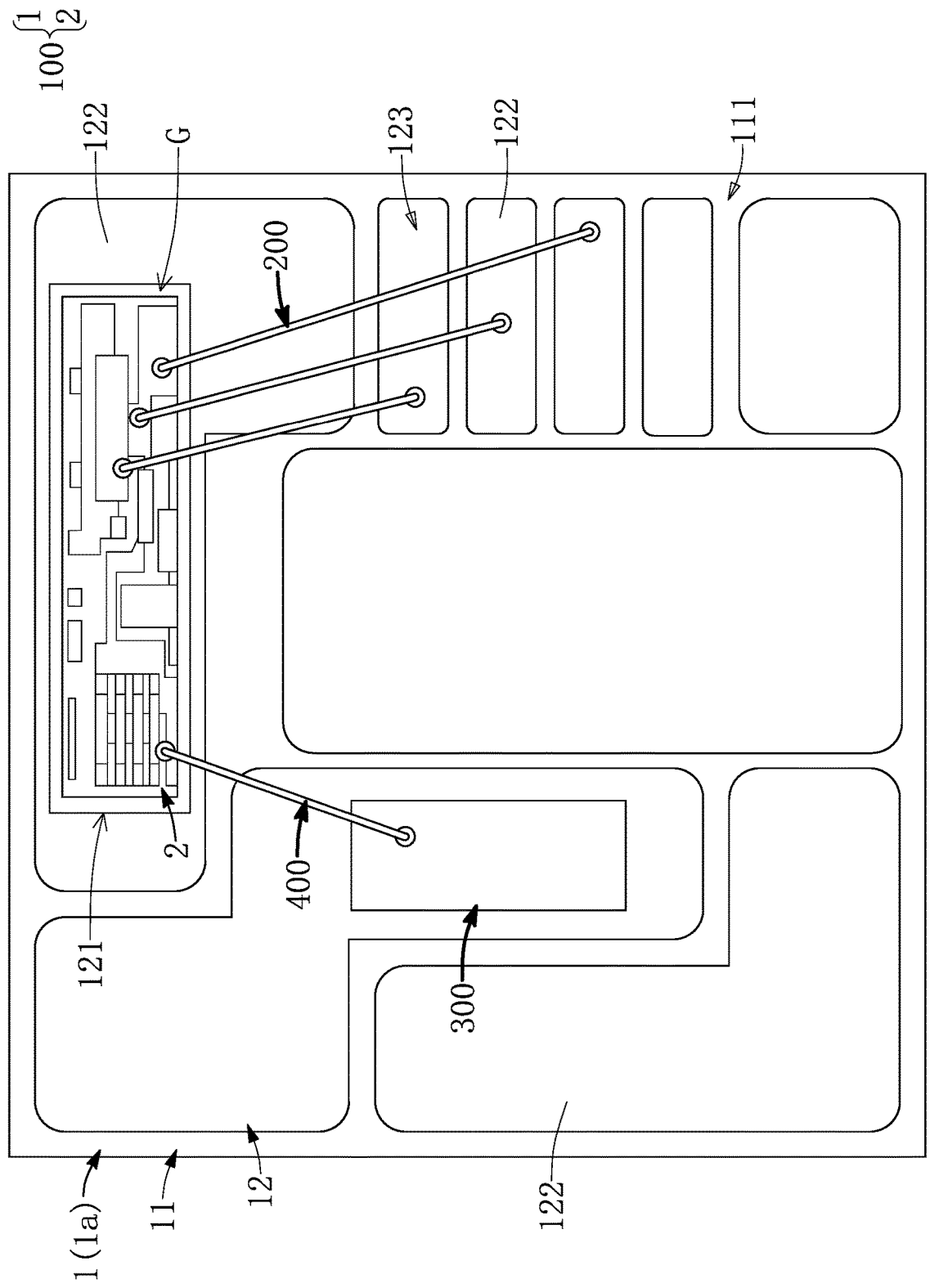
FIG. 3 is a schematic top view of the hybrid ceramic board having a second configuration according to the first embodiment of the present disclosure.

Specifically, the first conductive layer 12 has a circuit layout slot 121 that is recessed (e.g., by etching) along a predetermined direction D from an outer surface 123 thereof to the first surface 111 (e.g., a bottom of the circuit layout slot 121 is a part of the first surface 111). Moreover, a size or position of the circuit layout slot 121 can be adjusted or changed according to design requirements (e.g., the circuit layout slot 121 shown in FIG. 1 is arranged on a substantial center portion of the first surface 111; or, the circuit layout slot 121 shown in FIG. 3 is arranged adjacent to an outer edge of the first surface 111), but the present disclosure is not limited thereto.

Furthermore, the first conductive layer 12 has a plurality of first circuits 122 spaced apart from each other. Any two of the first circuits 122 adjacent to each other have a first conductor space G122 therebetween that has a first minimal critical interval. In other words, the ceramic carrier 1 cannot have a conductor space being less than the first minimal critical interval.

The DPC ceramic substrate 2 is disposed in the circuit layout slot 121 and is fixed onto the first surface 111, and a surrounding lateral side of the DPC ceramic substrate 2 is not in contact with inner walls of the circuit layout slot 121 so as to jointly form an annular gap G therebetween.

Specifically, the DPC ceramic substrate 2 in the present embodiment includes a ceramic sheet 21 not protruding from the circuit layout slot 121, a plurality of second circuits 22 direct-plated onto one side of the ceramic sheet 21, and a conductor layer 23 that is direct-plated onto another side of the ceramic sheet 21. In other words, the second circuits 22 are arranged on a top side of the DPC ceramic substrate 2 and can partially protrude from the circuit layout slot 121, but the present disclosure is not limited thereto. For example, in other embodiments of the present disclosure not shown in the drawings, the ceramic sheet 21 can partially protrude from (or can be partially exposed from) the circuit layout slot 121.

Moreover, along the predetermined direction D, the top side of the DPC ceramic substrate 2 and the outer surface 123 of the first conductive layer 12 have a step difference S therebetween that is less than or equal to 300 μm, so that the second circuits 22 of the DPC ceramic substrate 2 can be substantially coplanar with the first circuits 122 for jointly forming (providing) a circuit layout surface.

Figure 4:
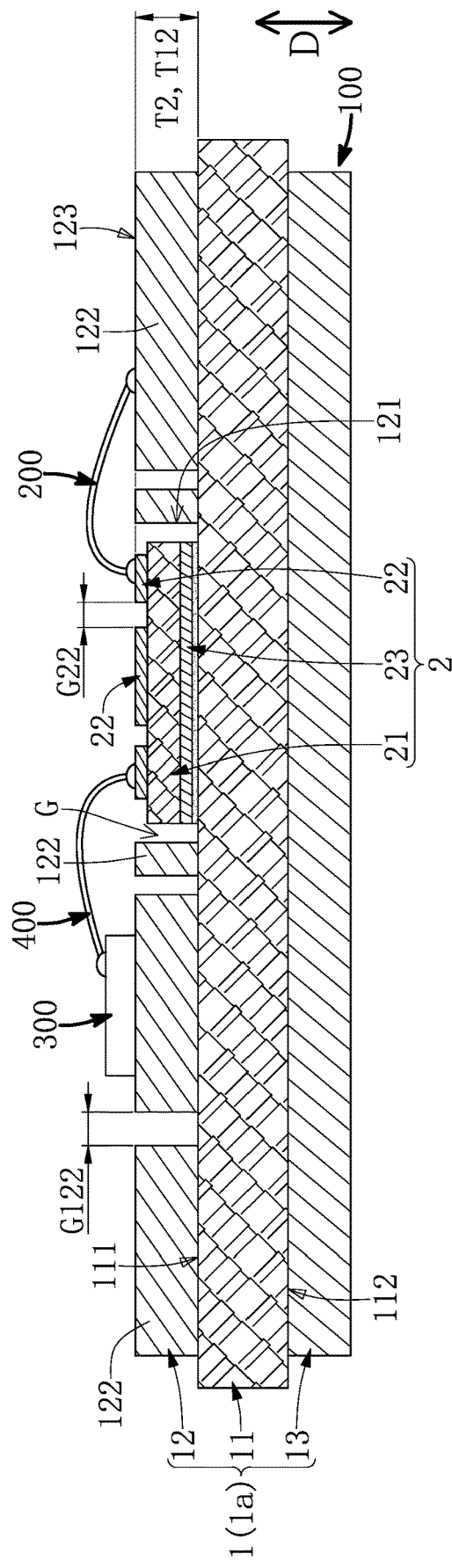
FIG. 4 is a schematic cross-sectional view showing the hybrid ceramic board of FIG. 2 in another configuration.
Figure 5:
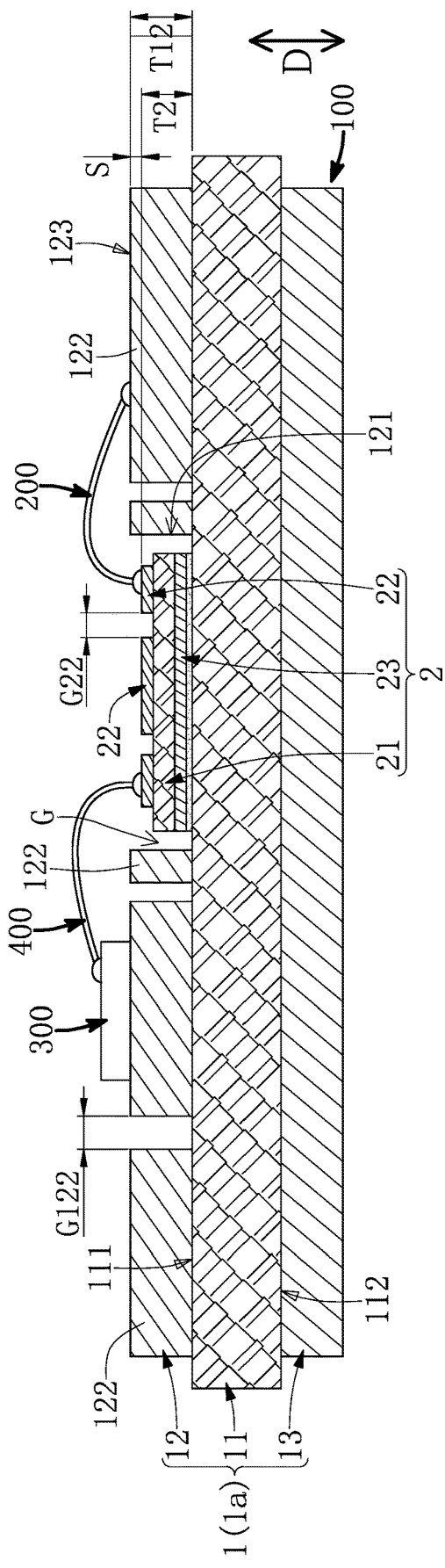
FIG. 5 is a schematic cross-sectional view showing the hybrid ceramic board of FIG. 2 in yet another configuration.

In the present embodiment, a thickness T2 of the DPC ceramic substrate 2 is slightly greater than a thickness T12 of the first conductive layer 12 (e.g., the DPC ceramic substrate 2 protrudes from the first conductive layer 12 by the step difference S being less than 300 μm), so that each of the second circuits 22 protrudes from the outer surface 123 of the first conductive layer 12, but the present disclosure is not limited thereto. For example, as shown in FIG. 4, the thickness T2 of the DPC ceramic substrate 2 can be equal to the thickness T12 of the first conductive layer 12, so that the second circuits 22 are coplanar with the first circuits 122. Or, as shown in FIG. 5, the thickness T2 of the DPC ceramic substrate 2 is slightly less than the thickness T12 of the first conductive layer 12 (e.g., the DPC ceramic substrate 2 is lower than the first conductive layer 12 by the step difference S being less than 300 μm), so that each of the second circuits 22 is lower than the outer surface 123 of the first conductive layer 12.

Specifically, as shown in FIG. 1 and FIG. 2, any two of the second circuits 22 adjacent to each other have a second conductor space G22 therebetween that has a second minimal critical interval being less than the first minimal critical interval. Accordingly, the hybrid ceramic board 100 of the present embodiment is provided with a specific configuration (e.g., the first circuits 122 and the second circuits 22 in the specific configuration having different conductor spaces and being substantially coplanar with each other) that is different from the configuration of the conventional ceramic substrate, so that the hybrid ceramic board 100 allows for a wider variety of electronic components to be mounted thereon for meeting a broader range of requirements and simplifying a manufacturing process of the IPM package structure 1000.

In summary, the hybrid ceramic board 100 provides a conductor space with a wider range by having the first conductor space G122 and the second conductor space G22, such that the hybrid ceramic board 100 can be applied to an IPM package structure, but the present disclosure is not limited thereto.

It should be noted that when the hybrid ceramic board 100 is applied to the IPM package structure, the ceramic carrier 1 (e.g., at least one of the first circuits 122) and the DPC ceramic substrate 2 (e.g., at least one of the second circuits 22) can be connected to each other through a plurality of first metal wires 200 so as to establish an electrical connection between the ceramic carrier 1 and the DPC ceramic substrate 2. Moreover, the first conductive layer 12 of the hybrid ceramic board 100 can provide a chip 300 to be disposed thereon, and the chip 300 and the DPC ceramic substrate 2 can be connected to each other through a plurality of second metal wires 400 so as to establish an electrical connection between the chip 300 and the DPC ceramic substrate 2.

Figure 6:
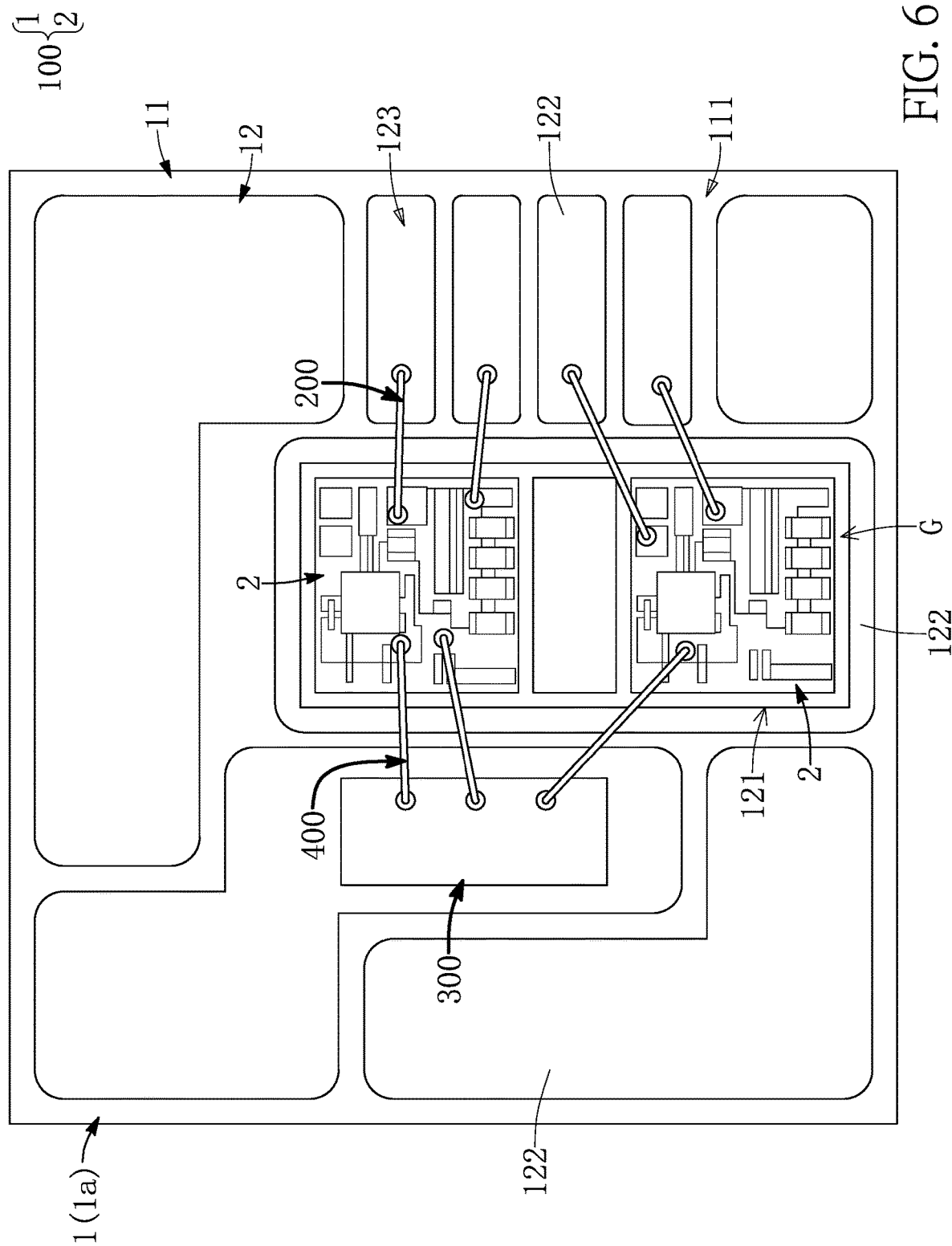
FIG. 6 is a schematic top view of the hybrid ceramic board having a third configuration according to the first embodiment of the present disclosure.
Figure 7:
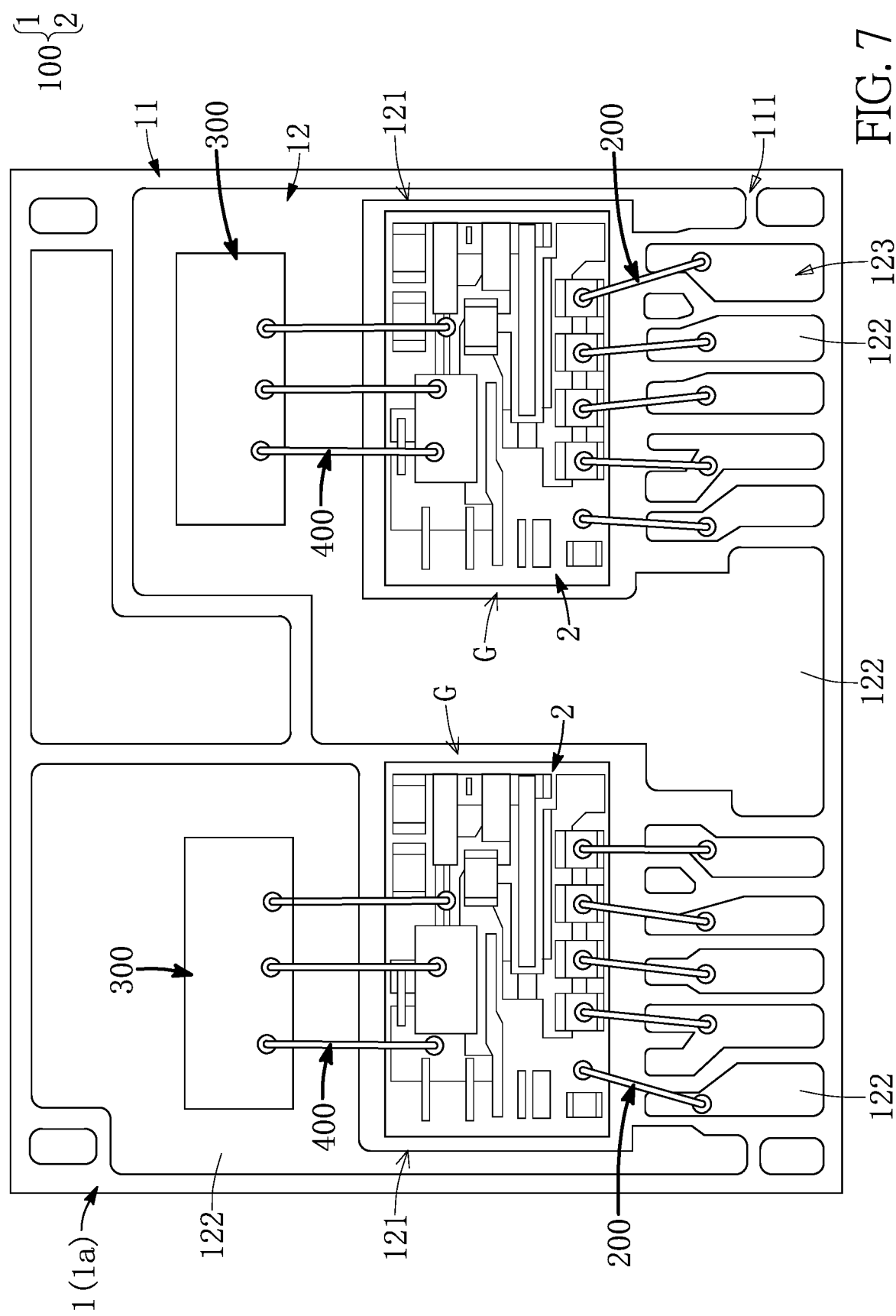
FIG. 7 is a schematic top view of the hybrid ceramic board having a fourth configuration according to the first embodiment of the present disclosure.

In addition, each of a quantity of the circuit layout slot 121 and a quantity of the DPC ceramic substrate 2 shown in FIG. 1 to FIG. 5 of the present embodiment is just one, but the present disclosure is not limited thereto. For example, as shown in FIG. 6 and FIG. 7, the quantity of the circuit layout slot 121 can be more than one according to design requirements and is greater than or equal to the quantity of the DPC ceramic substrate 2, but the DPC ceramic substrates 2 are only disposed on the first surface 111 of the ceramic carrier 111 (i.e., the second surface 112 cannot allow any DPC ceramic substrate 2 to be disposed thereon). Accordingly, each of the quantity of the circuit layout slot 121 and the quantity of the DPC ceramic substrate 2 can be at least one according to design requirements.

Second Embodiment

Figure 8:
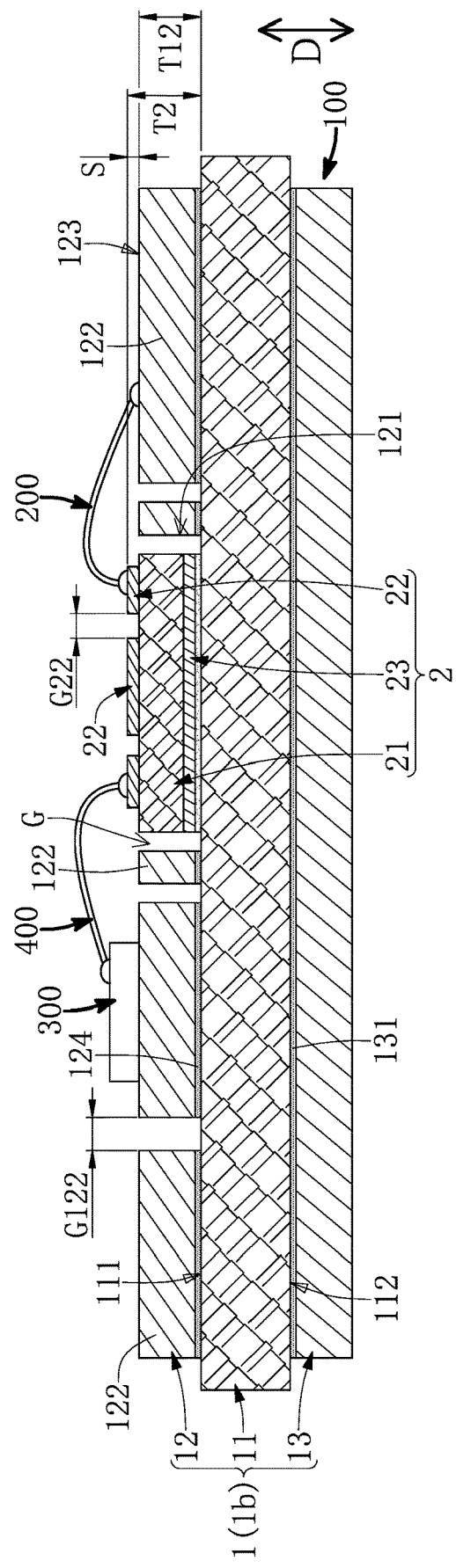
FIG. 8 is a schematic cross-sectional view of the hybrid ceramic board according to a second embodiment of the present disclosure.

Referring to FIG. 8, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the ceramic carrier 1 is an active metal brazing (AMB) ceramic substrate 1b, and the first conductive layer 12 and the second conductive layer 13 are brazed onto the first surface 111 and the second surface 112 of the insulating ceramic layer 11, respectively. In other words, the first conductive layer 12 and the second conductive layer 13 of the present embodiment are brazed onto the first surface 111 and the second surface 112 through two brazing layers 124, 131, respectively, but the present disclosure is not limited thereto.

Moreover, along the predetermined direction D, the top side of the DPC ceramic substrate 2 and the outer surface 123 of the first conductive layer 12 have a step difference S therebetween that is less than or equal to 300 μm. In the present embodiment, along the predetermined direction D, the thickness T2 of the DPC ceramic substrate 2 is preferably within a range from 90% to 110% of the thickness T12 of the first conductive layer 12. In addition, the second minimal critical interval is less than the first minimal critical interval. In summary, the hybrid ceramic board 100 can provide and effectively provide a conductor space with an expanded range by having the first conductor space G122 and the second conductor space G22.

Third Embodiment

Figure 9:
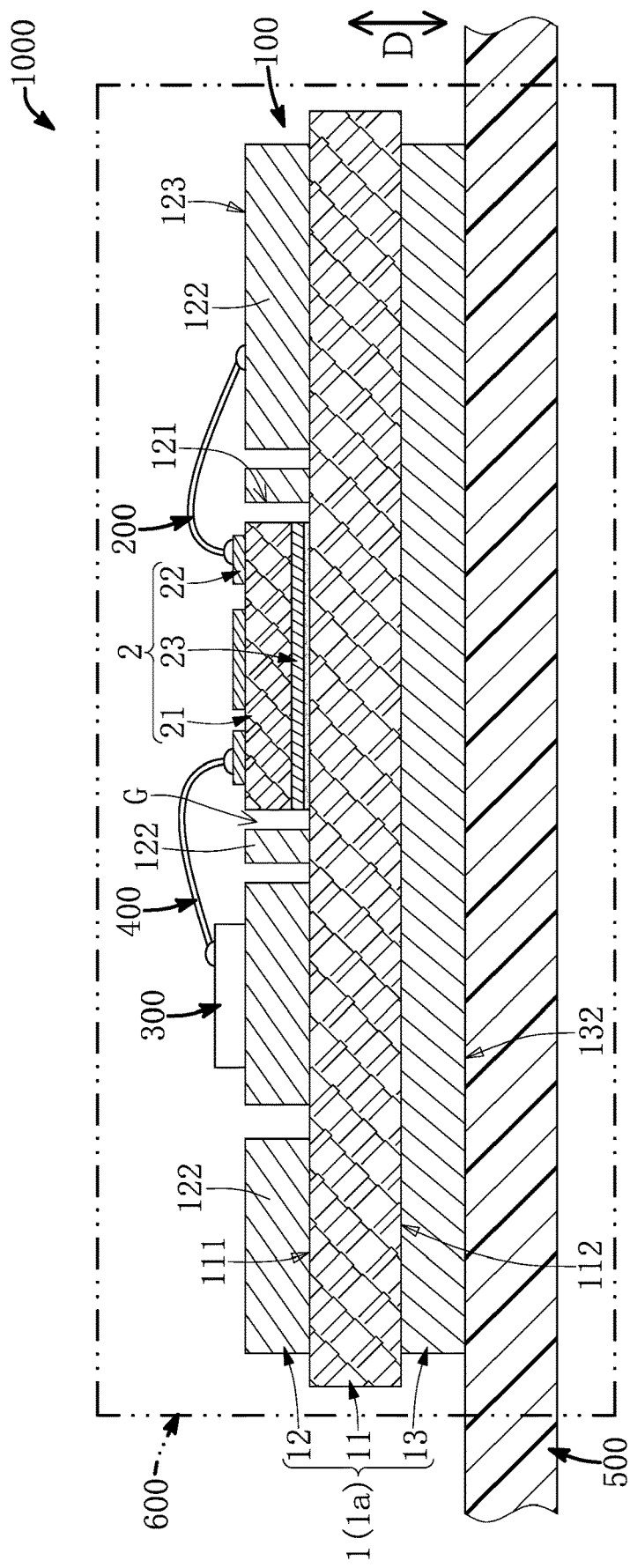
FIG. 9 is a schematic cross-sectional view of an intelligent power module (IPM) package structure according to a third embodiment of the present disclosure.
Figure 10:
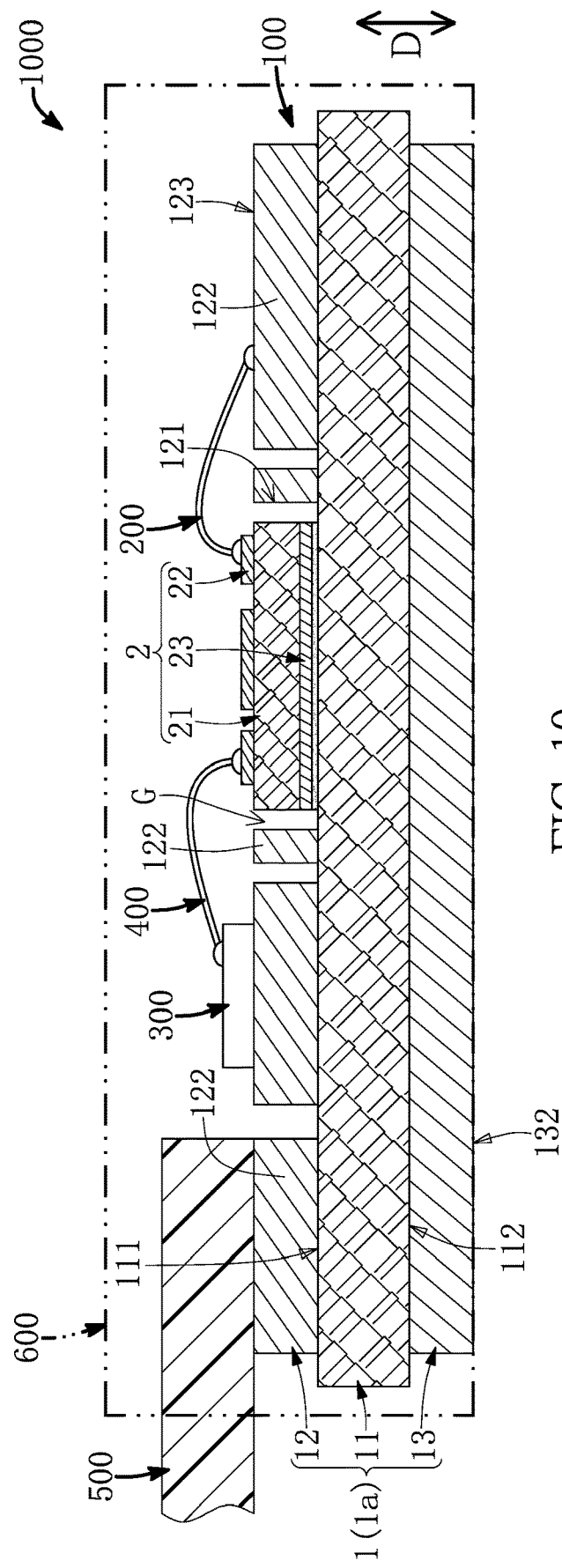
FIG. 10 is a schematic cross-sectional view of the IPM package structure in another configuration according to the third embodiment of the present disclosure.

Referring to FIG. 9 and FIG. 10, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

The present embodiment provides an intelligent power module (IPM) package structure 1000, which includes a hybrid ceramic board 100, a plurality of first metal wires 200 formed on the hybrid ceramic board 100, a chip 300 mounted on the hybrid ceramic board 100, a plurality of second metal wires 400 connecting the hybrid ceramic board 100 and the chip 300, a lead frame 500 connected to the hybrid ceramic board 100, and an encapsulant 600 that covers (or encapsulates) the above components, but the present disclosure is not limited thereto. For example, in other embodiments of the present disclosure not shown in the drawings, the lead frame 500 and/or the encapsulant 600 can be omitted or can be replaced by other components according to design requirements.

It should be noted that the hybrid ceramic board 100 in the present embodiment is limited to being applied in the IPM package structure 1000. Accordingly, any structure not applied to an IPM is different from the hybrid ceramic board 100 or the IPM package structure 1000 provided by the present embodiment.

Moreover, structures and connection relationships of the hybrid ceramic board 100, the first metal wires 200, the chip 300, and the second metal wires 400 are substantially identical to those of the first and second embodiments (e.g., the ceramic carrier 1 can be the DBC ceramic substrate 1a shown in FIG. 1 to FIG. 7 or the AMB ceramic substrate 1b shown in FIG. 8), and is not repeated in the present embodiment for the sake of brevity.

As shown in FIG. 9 of the present embodiment, the second conductive layer 13 of the ceramic carrier 1 is disposed on the lead frame 500 so as to establish an electrical connection between the ceramic carrier 1 and the lead frame 500. Specifically, the ceramic carrier 1, the DPC ceramic substrate 2, the first metal wires 200, the chip 300, the second metal wires 400, and a part of the lead frame 500 are embedded in the encapsulant 600, but the present disclosure is not limited thereto. For example, as shown in FIG. 10, the first conductive layer 12 of the ceramic carrier 1 is disposed on the lead frame 500 so as to enable an outer surface 132 of the second conductive layer 13 to be exposed from the encapsulant 600 and to be coplanar with an adjacent surface of the encapsulant 600, thereby effectively increasing the performance of heat-dissipation of the IPM package structure 1000.

In addition, the annular gap G of the hybrid ceramic board 100 in the present embodiment can be fully filled with the encapsulant 600, thereby further reinforcing the connection strength between the ceramic carrier 1 and the DPC ceramic substrate 2.

Beneficial Effects of the Embodiments

In conclusion, any one of the IPM package structure and the hybrid ceramic board of the present embodiment is provided with a specific configuration (e.g., the first circuits and the second circuits in the specific configuration having different conductor spaces and being substantially coplanar with each other) that is different from the configuration of the conventional ceramic substrate, so that the hybrid ceramic board allows for a wider variety of electronic components to be mounted thereon for meeting a broader range of requirements and simplifying a manufacturing process of the IPM package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An intelligent power module (IPM) package structure, comprising:
   a ceramic carrier including:
      an insulating ceramic layer having a first surface and a second surface that is opposite to the first surface;
      a first conductive layer connected to the first surface, wherein the first conductive layer has a circuit layout slot that is recessed along a predetermined direction from an outer surface thereof to the first surface of the insulating ceramic layer, wherein the first conductive layer has a plurality of first circuits spaced apart from each other, and wherein any two of the first circuits adjacent to each other have a first conductor space therebetween that has a first minimal critical interval; and
      a second conductive layer connected to the second surface;
   a direct-plated copper (DPC) ceramic substrate disposed in the circuit layout slot and fixed onto the first surface, wherein a surrounding lateral side of the DPC ceramic substrate is not in contact with inner walls of the circuit layout slot so as to jointly form an annular gap therebetween, wherein along the predetermined direction, a top side of the DPC ceramic substrate and the outer surface of the first conductive layer have a step difference therebetween that is less than or equal to 300 μm, wherein the top side of the DPC ceramic substrate has a plurality of second circuits, and wherein any two of the second circuits adjacent to each other have a second conductor space therebetween that has a second minimal critical interval being less than the first minimal critical interval;
   a plurality of first metal wires that are connected to the ceramic carrier and the DPC ceramic substrate so as to establish an electrical connection between the ceramic carrier and the DPC ceramic substrate;
   a chip disposed on the first conductive layer of the ceramic carrier; and
   a plurality of second metal wires that are connected to the chip and the DPC ceramic substrate so as to establish an electrical connection between the chip and the DPC ceramic substrate.

2. The IPM package structure according to claim 1, wherein the ceramic carrier is a direct bonded copper (DBC) ceramic substrate, and the first conductive layer and the second conductive layer are sintered onto the first surface and the second surface of the insulating ceramic layer, respectively.

3. The IPM package structure according to claim 1, wherein the ceramic carrier is an active metal brazing (AMB) ceramic substrate, and the first conductive layer and the second conductive layer are brazed onto the first surface and the second surface of the insulating ceramic layer, respectively.

4. The IPM package structure according to claim 1, further comprising a lead frame, wherein the ceramic carrier is disposed on and electrically coupled to the lead frame.

5. The IPM package structure according to claim 4, further comprising an encapsulant, wherein the second conductive layer of the ceramic carrier is disposed on the lead frame, and the ceramic carrier, the DPC ceramic substrate, the first metal wires, the chip, the second metal wires, and a part of the lead frame are embedded in the encapsulant.

6. The IPM package structure according to claim 4, further comprising an encapsulant, wherein the first conductive layer of the ceramic carrier is disposed on the lead frame, and wherein the ceramic carrier, the DPC ceramic substrate, the first metal wires, the chip, the second metal wires, and a part of the lead frame are embedded in the encapsulant, and an outer surface of the second conductive layer is exposed from the encapsulant.

7. The IPM package structure according to claim 1, wherein the DPC ceramic substrate includes a ceramic sheet not protruding from the circuit layout slot, and the second circuits are direct-plated onto the ceramic sheet.

8. A hybrid ceramic board, comprising:
a ceramic carrier including:
an insulating ceramic layer having a first surface and a second surface that is opposite to the first surface;
a first conductive layer connected to the first surface, wherein the first conductive layer has at least one circuit layout slot that is recessed along a predetermined direction from an outer surface thereof to the first surface of the insulating ceramic layer, wherein the first conductive layer has a plurality of first circuits spaced apart from each other, and wherein any two of the first circuits adjacent to each other have a first conductor space therebetween that has a first minimal critical interval; and
a second conductive layer connected to the second surface; and
at least one direct-plated copper (DPC) ceramic substrate disposed in the at least one circuit layout slot and fixed onto the first surface, wherein a surrounding lateral side of the at least one DPC ceramic substrate is not in contact with inner walls of the at least one circuit layout slot so as to jointly form an annular gap therebetween, and wherein, along the predetermined direction, a top side of the at least one DPC ceramic substrate and the outer surface of the first conductive layer have a step difference therebetween that is less than or equal to 300 µm;
wherein the top side of the at least one DPC ceramic substrate has a plurality of second circuits, and wherein any two of the second circuits adjacent to each other have a second conductor space therebetween that has a second minimal critical interval being less than the first minimal critical interval.

9. The hybrid ceramic board according to claim 8, wherein the ceramic carrier is not electrically coupled to the at least one DPC ceramic substrate.

10. The hybrid ceramic board according to claim 8, wherein the ceramic carrier is a direct bonded copper (DBC) ceramic substrate, and the first conductive layer and the second conductive layer are sintered onto the first surface and the second surface of the insulating ceramic layer, respectively.

11. The hybrid ceramic board according to claim 8, wherein the ceramic carrier is an active metal brazing (AMB) ceramic substrate, and the first conductive layer and the second conductive layer are brazed onto the first surface and the second surface of the insulating ceramic layer, respectively.

12. The hybrid ceramic board according to claim 8, wherein the at least one DPC ceramic substrate includes a ceramic sheet not protruding from the circuit layout slot, and the second circuits are direct-plated onto the ceramic sheet.

* * * * *